United States Patent
Tanaka et al.

(10) Patent No.: US 8,456,460 B2
(45) Date of Patent: Jun. 4, 2013

(54) SENSOR ELEMENT AND METHOD OF DRIVING SENSOR ELEMENT, AND INPUT DEVICE, DISPLAY DEVICE WITH INPUT FUNCTION AND COMMUNICATION DEVICE

(75) Inventors: Tsutomu Tanaka, Kanagawa (JP); Makoto Takatoku, Kanagawa (JP); Michiru Senda, Kanagawa (JP); Keiichiro Ishihara, Kanagawa (JP)

(73) Assignee: Japan Display West, Inc., Chita (JP)

( * ) Notice: Subject to any disclaimer, the term of this patent is extended or adjusted under 35 U.S.C. 154(b) by 819 days.

(21) Appl. No.: 12/562,317

(22) Filed: Sep. 18, 2009

(65) Prior Publication Data

US 2010/0085339 A1    Apr. 8, 2010

(30) Foreign Application Priority Data

Oct. 3, 2008  (JP) .................................. 2008-258862

(51) Int. Cl.
*G06F 3/038* (2006.01)

(52) U.S. Cl.
USPC .......................... 345/207; 345/204; 345/102

(58) Field of Classification Search
CPC .................................. G06F 3/038; G09G 3/38
USPC ........... 345/87, 102, 175, 207, 204; 348/310, 348/671
See application file for complete search history.

(56) References Cited

U.S. PATENT DOCUMENTS

| | | | |
|---|---|---|---|
| 6,512,547 B1 * | 1/2003 | Miida | 348/310 |
| 7,265,740 B2 | 9/2007 | Tada et al. | |
| 7,889,189 B2 * | 2/2011 | Fujita | 345/204 |
| 8,300,031 B2 * | 10/2012 | Kimura | 345/204 |
| 2004/0263469 A1 * | 12/2004 | Senda | 345/102 |
| 2007/0229484 A1 * | 10/2007 | Fujita et al. | 345/207 |
| 2008/0111779 A1 * | 5/2008 | Matsumoto | 345/87 |
| 2008/0158137 A1 * | 7/2008 | Yoshida | 345/102 |
| 2008/0174577 A1 * | 7/2008 | Fujita | 345/204 |
| 2010/0009487 A1 * | 1/2010 | Huo et al. | 438/57 |
| 2010/0066653 A1 * | 3/2010 | Yamazaki et al. | 345/76 |
| 2011/0181786 A1 * | 7/2011 | Yamazaki et al. | 348/671 |
| 2012/0056862 A1 * | 3/2012 | Yamazaki et al. | 345/207 |

FOREIGN PATENT DOCUMENTS

JP    2004-119719    4/2004

* cited by examiner

*Primary Examiner* — Thuy Pardo
(74) *Attorney, Agent, or Firm* — Robert J. Depke; The Chicago Technology Law Group, LLC

(57) ABSTRACT

The present invention provides a sensor element including two diode elements connected in series to each other, and a capacitive element having one end connected to a junction point between the two diode elements. Each of the diode elements includes a semiconductor layer having a p-type semiconductor region and an n-type semiconductor region facing each other in an in-plane direction, an anode electrode connected to the p-type semiconductor region, a cathode electrode connected to the n-type semiconductor region, a gate insulting film adjoining the semiconductor layer in a stacking direction, and a gate electrode facing the semiconductor layer with the gate insulating film in between.

18 Claims, 9 Drawing Sheets

SENSOR ELEMENT AND METHOD OF DRIVING SENSOR ELEMENT, AND INPUT DEVICE, DISPLAY DEVICE WITH INPUT FUNCTION AND COMMUNICATION DEVICE

The present application claims priority to Japanese Patent Application JP 2008-258862 filed in the Japan Patent Office on Oct. 3, 2008, the entire contents of which is hereby incorporated by reference.

BACKGROUND OF THE INVENTION

1. Field of the Invention

The present invention relates to a sensor element detecting energy, for example, light and heat, and a method of driving the sensor element, and an input device receiving an input of information in accordance with magnitude of the energy, a display device with an input function and a communication device.

2. Description of the Related Art

In recent years, flat display devices such as liquid crystal display devices and organic EL display devices have increasingly had multiple functions in which a screen input with a touch panel, a scanner, or the like, luminance control of a backlight, or the like is realized through arranging photo sensor elements along a display screen or in the vicinity thereof. As a photo sensor element provided in such a display device, a PIN-type thin film diode using a silicon (Si) thin film has been widely employed because of its simple manufacture process.

In the photo sensor element made of the PIN-type thin film diode, a semiconductor layer including a p-type semiconductor region and an n-type semiconductor region with an intrinsic semiconductor region in between is provided, and the intrinsic semiconductor region serves as a photo-reception section. In the photo sensor element having such a configuration, for the purpose of preventing leak current, proposed is the configuration in which a gate electrode is provided in a region facing the intrinsic semiconductor region with an insulating film in between (for example, Japanese Unexamined Patent Publication No. 2004-119719).

SUMMARY OF THE INVENTION

However, from the verification of this method, it is understood that even when the leak current is reduced by controlling the gate voltage, the leak current is reduced to only approximately 1/10 of that of the on-state in the gate voltage, at the most. Accordingly, in the following method of reading out a light current, there is such a failure that a signal may not be read when ten or more photo sensor elements are connected in series to one signal line. That is, the photo sensor elements are arranged in a matrix form, and a cathode of each photo sensor element is connected to a selection line, an anode of each photo sensor element is connected to a signal line, and a gate electrode is connected to a common line, thereby forming an image input circuit, and the photo sensor element becomes on-state by applying a constant voltage to the selection line, thereby reading out the light current. Thus, it is also considered to apply a circuit configuration used in a typical CMOS sensor, as the image input circuit. However, in this case, there is an issue that it is difficult to distinguish a signal light of a finger or the like which is originally desired to be obtained, from other extraneous light (for example, sunlight).

To solve this issue, for example, it is considered to eliminate the influence from the extraneous light by time-divisionally applying backlight light or light for detection (such as infrared light) from the backlight side to the finger or the like, and detecting the difference of only a signal reflected by the finger or the like when applying the light. However, even in this case, in the case where strong extraneous light is incident in the outdoor environment or the like, there is an issue that capacitive elements are saturated with the increase of the light current, and that it is difficult to detect the difference of only the reflected signal.

Thus, for example, there is also considered a method to eliminate the extraneous light element by aligning two photo sensor elements in series, and alternately switching two photo sensor elements with a switching transistor, in synchronization with lighting or unlighting of the backlight. However, in this case, there is an issue that the circuit configuration is extremely complicated, and that it is unrealistic to integrally form the image input circuit and a display device.

The above-described issue occurs not only in the case where the PIN-type thin film diode is used as the photo sensor element, but also in the case where a PN-type thin film diode is used as the photo sensor element, and the case where the diode such as the PIN-type thin film diode, and the PN-type thin film diode is used as the sensor element detecting energy such as heat.

In view of the foregoing, it is desirable to provide a sensor element capable of preventing saturation of a capacitive element, with a simple configuration, and capable of eliminating influence from external energy such as light, heat, or the like from the outside and a method of driving the sensor element, and an input device, a display with an input function and a communication device.

According to an embodiment of the present invention, there is provided a sensor element including: two diode elements connected in series to each other, and a capacitive element having one end connected to a junction point between the two diode elements. Each of the diode elements includes: a semiconductor layer having a p-type semiconductor region and an n-type semiconductor region facing each other in an in-plane direction; an anode electrode connected to the p-type semiconductor region; a cathode electrode connected to the n-type semiconductor region; a gate insulting film adjoining the semiconductor layer in a stacking direction; and a gate electrode facing the semiconductor layer with the gate insulating film in between.

The sensor element according to the embodiment of the present invention has a simple circuit configuration in which two diode elements are connected in series to each other, and one end of a capacitive element is connected to a junction point of the two diode elements. In addition to the anode electrode and the cathode electrode, each of the diode elements includes a gate electrode facing the semiconductor layer with the gate insulating film in between. Thereby, for example, it is possible to turn on and off the two diode elements separately from each other through controlling: relationship of electric potential between the cathode electrode and the gate electrode in a first diode element as one of the two diode elements, the anode electrode of the first diode element being connected to the capacitive element; and relationship of electric potential between the anode electrode and the gate electrode in a second diode element as the other of the two diode elements, the cathode electrode of the second diode element being connected to the capacitive element. Here, for example, in the case where a light source is arranged in back of the diode elements, and the two diode elements are turned on and off, in synchronization with lighting and unlighting of the light source, it is possible to eliminate an element of the external energy such as light and heat from the outside, without saturating the capacitive element.

According to the embodiment of the present invention, there is provided an input device including: a plurality of sensor elements arranged in a matrix form in a plane, and a drive section driving the plurality of sensor elements. The drive section turns on and off the two diode elements separately from each other through controlling: relationship of electric potential between the cathode electrode and the gate electrode in a first diode element as one of the two diode elements, the anode electrode of the first diode element being connected to the capacitive element; and relationship of electric potential between the anode electrode and the gate electrode in a second diode element as the other of the two diode elements, the cathode electrode of the second diode element being connected to the capacitive element.

According to the embodiment of the present invention, there is provided a display device with an input function including: a plurality of display elements and a plurality of sensor elements arranged in a matrix form in a plane and a drive section driving the plurality of display elements and the plurality of sensor elements. The drive section turns on and off the two diode elements separately from each other through controlling: relationship of electric potential between the cathode electrode and the gate electrode in a first diode element as one of the two diode elements, the anode electrode of the first diode element being connected to the capacitive element; and relationship of electric potential between the anode electrode and the gate electrode in a second diode element as the other of the two diode elements, the cathode electrode of the second diode element being connected to the capacitive element.

According to the embodiment of the present invention, there is provided a communication device including: one or more sensor elements and a drive section driving the plurality of sensor elements. The drive section turns on and off the two diode elements separately from each other through controlling: relationship of electric potential between the cathode electrode and the gate electrode in a first diode element as one of the two diode elements, the anode electrode of the first diode element being connected to the capacitive element; and relationship of electric potential between the anode electrode and the gate electrode in a second diode element as the other of the two diode elements, the cathode electrode of the second diode element being connected to the capacitive element.

The input device, the display device with the input function, and the communication device according to the embodiment of the present invention each has a simple circuit configuration in which two diode elements are connected in series to each other, and one end of a capacitive element is connected to a junction point of the two diode elements. In addition to the anode electrode and the cathode electrode, each of the diode elements includes a gate electrode facing the semiconductor layer with the gate insulating film in between. Thereby, for example, with the drive section, it is possible to turn on and off the two diode elements separately from each other through controlling: relationship of electric potential between the cathode electrode and the gate electrode in a first diode element as one of the two diode elements, the anode electrode of the first diode element being connected to the capacitive element and relationship of electric potential between the anode electrode and the gate electrode in a second diode element as the other of the two diode elements, the cathode electrode of the second diode element being connected to the capacitive element. Here, for example, in the case where a light source is arranged in back of the diode elements, and the two diode elements are turned on and off, in synchronization with lighting and unlighting of the light source, it is possible to eliminate an element of the external energy such as light and heat from the outside, without saturating the capacitive element.

In a method of driving a sensor element according to the embodiment of the present invention, in the sensor element, the method including: controlling relationship of electric potential between the cathode electrode and the gate electrode in a first diode element as one of the two diode elements, the anode electrode of the first diode element being connected to the capacitive element; and controlling relationship of electric potential between the anode electrode and the gate electrode in a second diode element as the other of the two diode elements, the cathode electrode of the second diode element being connected to the capacitive element, thereby to turn on and off the two diode elements separately from each other.

In the method of driving the sensor element according to the embodiment of the present invention, in the sensor element having the above-described simple circuit configuration, by controlling relationship of electric potential between the cathode electrode and the gate electrode in a first diode element, and controlling relationship of electric potential between the anode electrode and the gate electrode in a second diode element, it is possible to turn on and off the two diode elements separately from each other. Here, for example, in the case where a light source is arranged in back of the diode elements, and the two diode elements are turned on and off, in synchronization with lighting and unlighting of the light source, it is possible to eliminate an element of the external energy such as light and heat from the outside, without saturating the capacitive element.

In the sensor element, the input device, the display device with the input function, and the communication device according to the embodiment of the present invention, by controlling relationship of electric potential between the cathode electrode and the gate electrode in a first diode element, and controlling relationship of electric potential between the anode electrode and the gate electrode in a second diode element, it is possible to turn on and off the two diode elements separately from each other. Thereby, with the simple configuration, it is possible to prevent saturation of the capacitive element, and it is possible to eliminate influence from the external energy such as light and heat from the outside.

In the method of driving the sensor element according to the embodiment of the present invention, by controlling relationship of electric potential between the cathode electrode and the gate electrode in a first diode element, and controlling relationship of electric potential between the anode electrode and the gate electrode in a second diode element, it is possible to turn on and off the two diode elements separately from each other. Therefore, with the simple configuration, it is possible to prevent saturation of the capacitive element, and it is possible to eliminate influence from the external energy such as light and heat from the outside.

Other and further objects, features and advantages of the invention will appear more fully from the following description.

DETAILED DESCRIPTION OF THE PREFERRED EMBODIMENT

A Preferred embodiment (hereafter, simply referred to as an embodiment) of the present invention will be described in detail with reference to the accompanying drawings.

Figure 1:
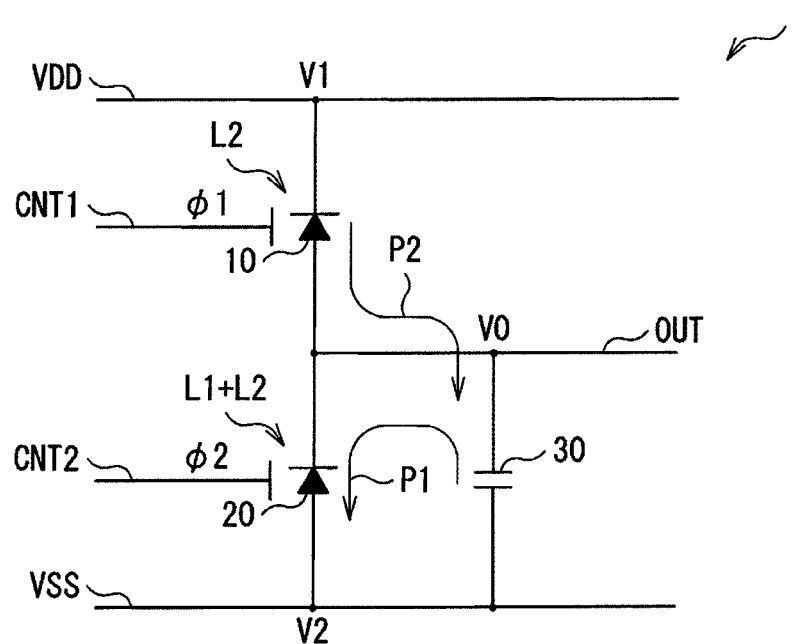
FIG. 1 is a circuit view of a photo sensor element according to an embodiment of the present invention.

FIG. 1 illustrates an example of a circuit configuration of a sensor element 1 according to an embodiment of the present invention. On an insulating substrate, for example, a plastic film substrate or a glass substrate, which is not illustrated in the figure, the sensor element 1 according to the embodiment is formed together with a light emitting element such as an organic EL element, and a liquid crystal element.

The sensor element 1 includes, for example, diode elements 10 and 20, and a capacitive element 30. The diode elements 10 and 20 each generate electric charge in accordance with the magnitude of energy such as applied light or heat, and each include a photodiode. The capacitive element 30 accumulates the electric charge generated in the diode element 10, releases the accumulated electric charge in accordance with the amount of the electric charge generated in the diode element 20, and is configured with a capacitor.

In the embodiment, the diode element 10 corresponds to a specific example of "a first diode" according to the embodiment of the present invention, and the diode element 20 corresponds to a specific example of "a second diode" according to the embodiment of the present invention. The internal configuration of the diode elements 10 and 20 will be described later.

In the sensor element 1, for example, a cathode of the diode element 10 is connected to a power source voltage line VDD, and an anode of the diode element 10 is connected to a cathode of the diode element 20, one end of the capacitive element 30, and one end of an output line OUT. An anode of the diode element 20 is connected to a reference voltage line VSS, and the other end of the capacitive element 30 is connected to, for example, the reference voltage line VSS. Moreover, a gate of the diode element 10 is connected to one end of a control line CNT1, and a gate of the diode element 20 is connected to one end of a control line CNT2. The control lines CNT1, and CNT2 are separate wiring insulated and isolated from each other. The other end of the capacitive element 30 may be connected to a voltage line (not illustrated in the figure) different from the reference voltage line VSS.

Figure 2:
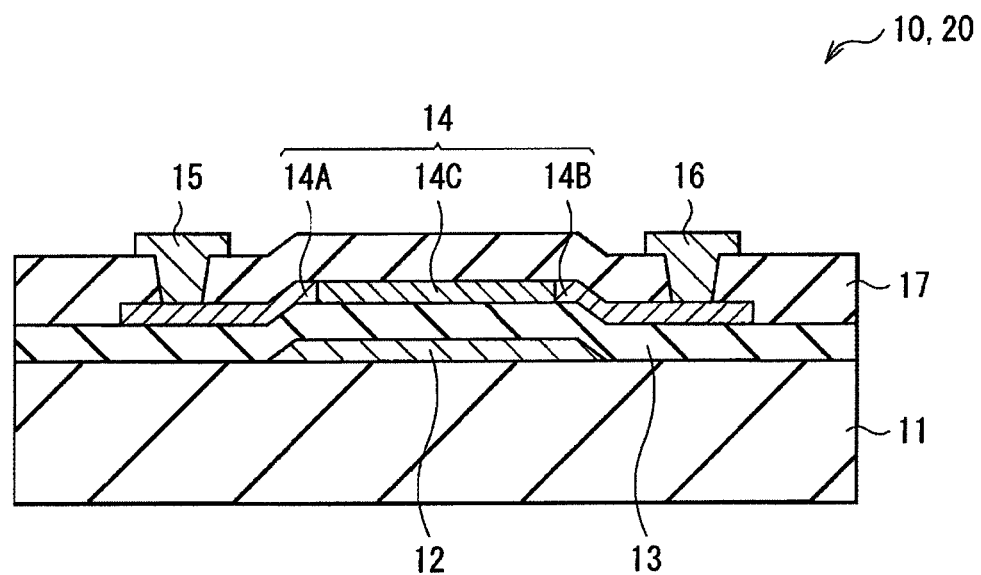
FIG. 2 is a cross-sectional view of a diode element of FIG. 1.

FIG. 2 illustrates an example of the cross-sectional configuration of the diode elements 10 and 20 of FIG. 1. Each of these diode elements 10 and 20 is, for example, a bottom-gate type thin film diode including a gate electrode 12, a gate insulating film 13, a semiconductor layer 14, an anode electrode 15, and a cathode electrode 16 on a substrate 11 in this order from the substrate 11 side.

The substrate 11 is an insulating substrate, for example, a plastic film substrate or a glass substrate. The gate electrode 12 is, for example, made of aluminum (Al) or molybdenum (Mo). The gate electrode 12 is formed in a region facing at least an intrinsic semiconductor region 14C which will be described later, and has, for example, a rectangular shape. In FIG. 2, an example is indicated where the gate electrode 12 is formed in a region facing not only the intrinsic semiconductor region 14C, but also a portion including a part of a p-type semiconductor region 14A, and a part of an n-type semiconductor region 14B, which will be described later. Thereby, the gate electrode 12 is a low-resistance electrode, and serves as a light shielding film which blocks the light from the substrate 11 side, from entering to the intrinsic semiconductor region 14C. In the case where the semiconductor layer 14 does not include the intrinsic semiconductor region 14C, and the p-type semiconductor region 14A and the n-type semiconductor region 14B directly make junction with each other, the gate electrode 12 is formed in a region facing a portion including a junction of the p-type semiconductor region 14A and the n-type semiconductor region 14B.

The gate insulating film 13 mainly contains, for example, silicon oxide ($SiO_2$), silicon nitride (SiN), or the like. The gate insulating film 13 faces the semiconductor layer 14 in a stacking direction. The gate insulating film 13 is, for example, formed in a region at least facing a portion including the intrinsic semiconductor region 14C, or in a region facing a portion including the junction of the p-type semiconductor region 14A and the n-type semiconductor region 14B. The gate insulating film 13 is, for example, formed so as to cover the gate electrode 12. In FIG. 2, an example where the gate insulating film 13 is formed over the whole surface of the substrate 11 including the gate electrode 12 is indicated.

The semiconductor layer 14 is formed so as to intersect a region facing the gate electrode 12, and is formed so as to extend in a direction (will be described later) where the anode electrode 15 and the cathode electrode 16 face each other. The top surface of this semiconductor layer 14 is covered with the insulating film 17, except a contact portion where the semiconductor layer 14 and the anode electrode 15 are in contact with each other, and a contact portion where the semiconductor layer 14 and the cathode electrode 16 are in contact with each other. In the top surface of the insulating film 17, the region facing the portion including the intrinsic semiconductor region 14C, or the region facing the portion including the junction of the p-type semiconductor region 14A and the n-type semiconductor region 14B is a light incident face to which light enters from the outside. The insulating film 17 is made of material transparent to the incident light, and mainly contains, for example, silicon oxide ($SiO_2$), silicon nitride (SiN), or the like. The semiconductor layer 14 includes at least the p-type semiconductor region 14A and the n-type semiconductor region 14B facing each other in an in-plane direction, and optionally includes the intrinsic semiconductor region 14C between the p-type semiconductor region 14A and the n-type semiconductor region 14B. In FIG. 2, an example where the intrinsic semiconductor region 14C is provided in the semiconductor layer 14 is indicated. As indicated in FIG. 2, in the case where the intrinsic semiconductor region 14C is provided in the semiconductor layer 14, the p-type semiconductor region 14A and the n-type semiconductor region 14B are not directly in contact with each other, and are arranged with the intrinsic semiconductor region 14C in between. Therefore, in this case, a PIN structure is formed in the semiconductor layer 14 in the in-plane direction. On the other hand, in the case where the intrinsic semiconductor region 14C is not provided in the semiconductor layer 14, the p-type semiconductor region 14A and the n-type semiconductor region 14B are directly in contact with each other. Therefore, in this case, a PN structure is formed in the semiconductor layer 14 in the in-plane direction.

Here, the p-type semiconductor region 14A is made of, for example, a silicon thin film containing p-type impurities, and the n-type semiconductor region 14B is made of, for example, a silicon thin film containing n-type impurities. The intrinsic semiconductor region 14C is made of, for example, a silicon thin film in which impurities are undoped.

The anode electrode 15 and the cathode electrode 16 are made of, for example, Al. The anode electrode 15 and the cathode electrode 16 are each formed in an opening formed in the insulating film 17, and the top surface of each of the anode electrode 15 and the cathode electrode 16 is exposed from the insulating film 17. The anode electrode 15 is electrically connected to the p-type semiconductor region 14A, and the cathode electrode 16 is electrically connected to the n-type semiconductor region 14B.

Next, operation of the sensor element 1 according to the embodiment will be described.

In the sensor element 1, I-V characteristics of the diode elements 10 and 20 are controlled with, for example, a voltage value of three electrodes, the gate electrode 12, the anode electrode 15, and the cathode electrode 16. Specifically, by changing the relationship of the electric potential between the cathode electrode 16 and the gate electrode 12 in the diode element 10, and changing the relationship of the electric potential between the anode electrode 15 and the gate electrode 12 in the diode element 20, the two diode elements 10 and 20 are turned on and off separately (for example, alternately) from each other.

Figure 3:
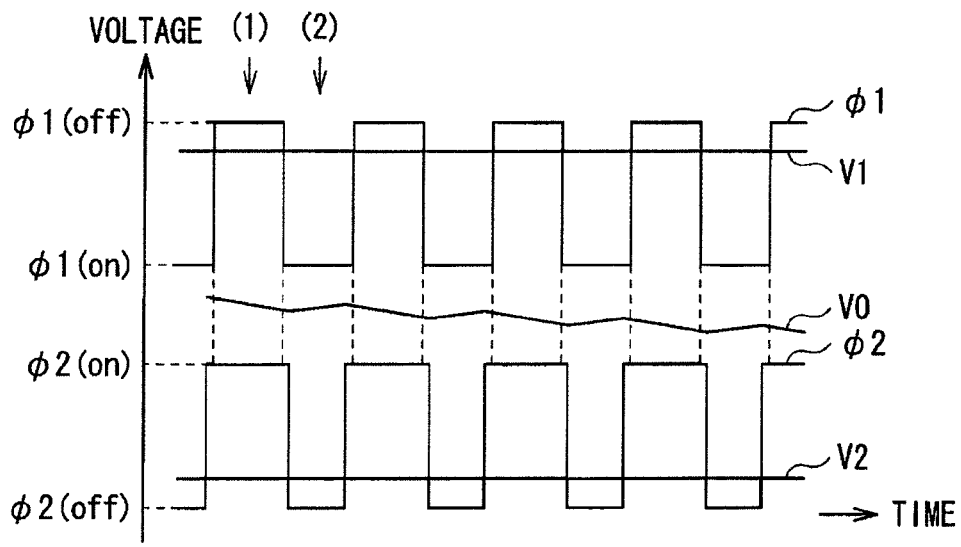
FIG. 3 is a waveform diagram for explaining an example of on-off control of the photo sensor element of FIG. 1.

FIG. 3 is a waveform diagram for explaining an example of on-off control (switching control) of the two diode elements 10 and 20. In the figure, $\phi1$ indicates a voltage of the gate electrode 12 in the diode element 10. V1 indicates a voltage of the cathode electrode 16 in the diode element 10. $\phi2$ indicates a voltage of the gate electrode 12 in the diode element 20. V2 indicates a voltage of the anode electrode 15 in the diode element 20. Vo indicates a voltage at a junction point of the diode elements 10 and 20 connected in series to each other, and corresponds to an output voltage of the sensor element 1. $\phi1$ (on) indicates a voltage of the gate electrode 12 in the on-state in the diode element 10. $\phi1$ (off) indicates a voltage of the gate electrode 12 in the off-state in the diode element 10. $\phi2$ (on) indicates a voltage of the gate electrode 12 in the on-state in the diode element 20. $\phi2$ (off) indicates a voltage of the gate electrode 12 in the off-state in the diode element 20. (1) in the figure indicates a timing when the diode element 10 is turned off, and the diode element 20 is turned on. (2) in the figure indicates a timing when the diode element 10 is turned on, and the diode element 20 is turned off.

As indicated in FIG. 3, at the timing (1), under the conditions that V1 and V2 are set to constant values, $\phi1$ is raised to $\phi1$ (off) and the diode element 10 is turned off, and $\phi2$ is raised to $\phi2$ (on) and the diode element 20 is turned on. At this time, for example, it is assumed as follows. Visible light or infrared light is emitted from the back (rear surface of the substrate 11) side of the diode elements 10 and 20 in synchronization with the on-state of the diode element 20, and the emitted light is reflected by an object such as a finger, and a pen disposed above the sensor element 1 (above the surface on the opposite side from the substrate 11). The reflected light as being a reflected light L1 as well as an extraneous light L2 (environment light) enters to the diode element 20. Thus, in this case, in accordance with the light amount of the light (the reflected light L1 and the extraneous light L2) entering to the diode element 20, the electric charge is released from the capacitive element 30 through a path P1 (refer to FIG. 1), and the output voltage Vo decreases.

As indicated in FIG. 3, at a timing (2), under the conditions that V1 and V2 are set to constant values, $\phi1$ is reduced to $\phi1$ (on) and the diode element 10 is turned on, and $\phi2$ is reduced to $\phi2$ (off) and the diode element 20 is turned off. At this time, for example, it is assumed as follows. The visible light or the infrared light emitted from the back side of the diode elements 10 and 20 is turned off in synchronization with the off-state of the diode element 20, and there is no light reflected by the object such as the finger and the pen disposed above the sensor element 1. Only the extraneous light L2 enters to the diode element 10. In this case, in accordance with the light amount of the light (extraneous light L2) entering to the diode element 10, the electric charge is accumulated in the capacitive element 30 through a path P2 (refer to FIG. 1), and the output voltage Vo slightly increases.

The relationship between the amounts of $\phi1$ (on), $\phi1$ (off), $\phi2$ (on), and $\phi2$ (off) described above is expressed with formulas below.

$$\phi1(on) < \phi1(off)$$

$$\phi2(on) > \phi2(off)$$

The release operation and the accumulation operation of the electric charge as described above are repeated, and the electric charge accumulated in the capacitive element 30 is finally read out as a detection signal. Specifically, the output voltage Vo is read out from the output line OUT. In the output voltage Vo obtained in this manner, the element of the extraneous light L2 is subtracted. Therefore, as indicated in FIG. 3, by performing on-off control (switching control) of two diode elements 10 and 20, the influence from the extraneous light L2 is eliminated, and it is possible to detect a signal reflected by the object such as the finger, and the pen disposed above the sensor element 1.

As indicated in FIG. 3, the period when the diode element 10 becomes the off-state, and the period when the diode element 20 becomes the off-state preferably do not overlap with each other.

As indicated in FIG. 3, when the diode elements 10 and 20 become the off-state, the difference in the electric potential between V1 and $\phi1$ (off), and the difference in the electric potential between V2 and $\phi2$ (off) are preferably as small as possible. In particular, in the case where a low-temperature polysilicon film is used as the semiconductor layer 14, when the difference in the electric potential as described above is large, the electric charge is likely to be trapped at a defect level in a film or crystal grain boundary. As a result, when the diode elements 10 and 20 are shifted from the on-state to the off-state, and shifted from the off-state to the on-state, the trap and the detrap occur, and there is a case where it is difficult to take out an accurate light signal. On the other hand, when the difference in the electric potential as described above is small, such an issue does not occur, and the switching operation may be performed at high speed.

Next, the on-off control (switching control) of the diode elements 10 and 20 will be described.

Figure 4:
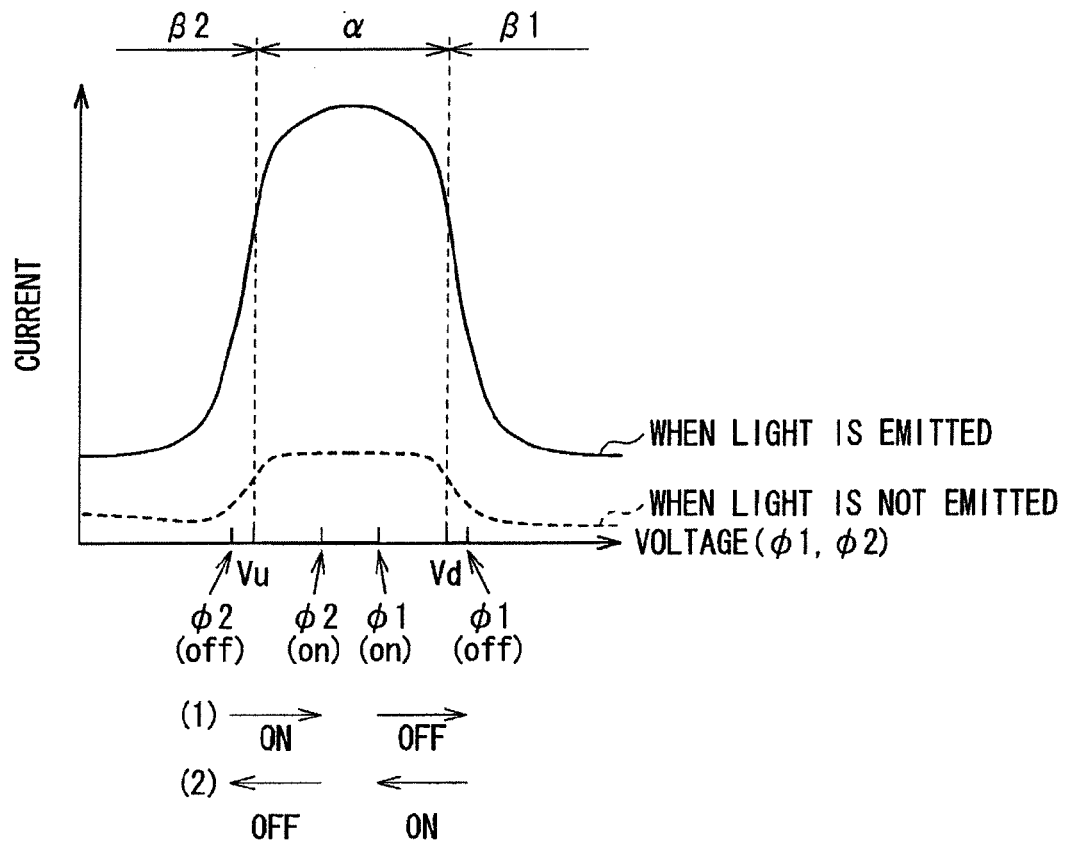
FIG. 4 is a characteristic view illustrating I-V characteristics of the diode element of FIG. 1.

FIG. 4 illustrates an example of the I-V characteristics of the diode elements 10 and 20. The horizontal axis indicates the gate voltage, and the vertical axis indicates the current flowing through the diode elements 10 and 20. In the figure, Vu indicates a rising voltage in which an output current rapidly increases, when the gate voltage is gradually raised. Vd indicates a falling voltage in which the output current rapidly decreases, when the gate voltage is gradually raised. Although the rising voltage and the falling voltage of the diode element 10 are basically approximately similar to those of the diode element 20, it is assumed for convenience sake that the rising voltage of the diode element 10 is Vg1, the falling voltage of the diode element 10 is Vg2, the rising voltage of the diode element 20 is Vg3, and the falling voltage of the diode element 20 is Vg4.

The magnitude of the current flowing through the diode elements 10 and 20 changes depending on the relationship of the electric potential between the cathode electrode 16 and the gate electrode 12, and the relationship of the electric potential between the anode electrode 15 and the gate electrode 12. Specifically, when the voltage $\phi 1$ of the gate electrode 12 in the diode element 10 and the voltage $\phi 2$ of the gate electrode 12 in the diode element 20 are equal to or smaller than the rising voltage Vu (Vg1 and Vg3), and when the voltage $\phi 1$ of the gate electrode 12 in the diode element 10 and the voltage $\phi 2$ of the gate electrode 12 in the diode element 20 are equal to or larger than the rising voltage Vd (Vg2 and Vg4), the diode elements 10 and 20 are turned off, and the current is less likely to flow (refer to off-operation regions $\beta 1$ and $\beta 2$ in FIG. 4). On the other hand, when the voltage $\phi 1$ of the gate electrode 12 in the diode element 10 and the voltage $\phi 2$ of the gate electrode 12 in the diode element 20 are larger than the rising voltage Vu (Vg1 and Vg3), and smaller than the falling voltage Vd (Vg2 and Vg4), the diode elements 10 and 20 are turned on, and a large amount of current flows (refer to an on-operation region $\alpha$ in FIG. 4). Here, it is assumed that the voltage V1 of the cathode electrode 16 in the diode element 10 and the voltage V2 of the anode electrode 15 in the diode element 20 are set to constant values.

Therefore, these features are positively utilized, and it is possible to perform the on-off control (switching control) of the diode elements 10 and 20 by controlling the voltages $\phi 1$ and $\phi 2$ of the gate electrodes 12.

Specifically, as indicated with (1) in FIG. 4 (corresponding to (1) in FIG. 3), the voltage $\phi 1$ of the gate electrode 12 is shifted from $\phi 1$ (on) to $\phi 1$ (off) (shifted from the on-operation region $\alpha$ to the off-operation region $\beta 1$). The voltage $\phi 2$ of the gate electrode 12 is shifted from $\phi 2$ (off) to $\phi 2$ (on) (shifted from the off-operation region $\beta 2$ to the on-operation region $\alpha$). Thereby, the diode element 20 may be turned off, and the diode element 10 may be turned on. At this time, formula (3) and formula (4) below are established.

$$Vg2<\phi 1 \quad (3)$$

$$Vg3<\phi 2<Vg4 \quad (4)$$

As indicated with (2) in FIG. 4 (corresponding to (2) in FIG. 3), the voltage $\phi 1$ of the gate electrode 12 is shifted from $\phi 1$ (off) to $\phi 1$ (on) (shifted from the off-operation region $\beta 1$ to the on-operation region $\alpha$). The voltage $\phi 2$ of the gate electrode 12 is shifted from $\phi 2$ (on) to $\phi 2$ (off) (shifted from the on-operation region $\alpha$ to the off-operation region $\beta 2$). Thereby, the diode element 20 may be turned on, and the diode element 10 may be turned off. At this time, formula (1) and formula (2) below are established.

$$Vg1<\phi 1<Vg2 \quad (1)$$

$$\phi 2<Vg3 \quad (2)$$

In this manner, in the embodiment, by positively utilizing the I-V characteristics of the diode elements 10 and 20, the on-off control (switching control) of the diode elements 10 and 20 is realized with the simple configuration in which the diode elements 10 and 20 are connected in series to each other.

In the embodiment, since the on-off control (switching control) of the diode elements 10 and 20 is performed, the capacitive element 30 is not saturated even in the case where strong extraneous light is incident in the outdoor environment or the like, and it is possible to properly detect the signal reflected by the object such as the finger, and the pen disposed above the sensor element 1.

Modifications

In the sensor element 1 according to the embodiment, it is possible to perform operation different from that of FIG. 3, without losing the above-described effects.

Modification 1

Figure 5:
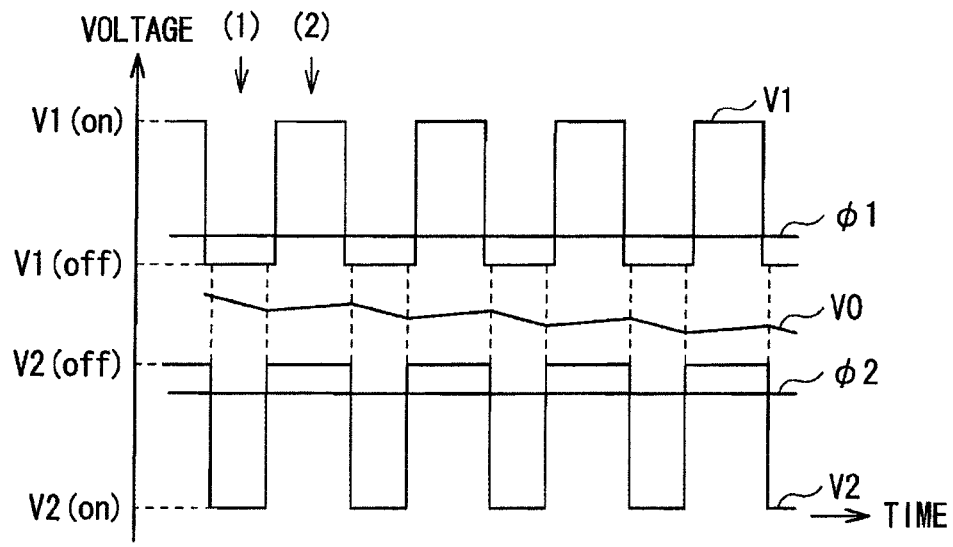
FIG. 5 is a waveform diagram for explaining another example of the on-off control of the photo sensor element of FIG. 1.

FIG. 5 is a waveform diagram for explaining another example of the on-off control (switching control) of the two diode elements 10 and 20. Each of reference numerals in the figure indicates identical components as those illustrated in FIG. 3. In FIG. 5, $\phi 1$ and $\phi 2$ are set to constant values, and V1 and V2 change in rectangular shapes.

As indicated in FIG. 5, at a timing of (1), under the conditions that $\phi 1$ and $\phi 2$ are set to constant values, V1 is reduced to V1 (off) and a diode element 10 is turned off; and V2 is reduced to V2 (on) and a diode element 20 is turned on. At this time, for example, it is assumed as follows. Visible light or infrared light is emitted from the back (rear surface of a substrate 11) side of the diode elements 10 and 20 in synchronization with the on-state of the diode element 20, and the emitted light is reflected by an object such as a finger, and a pen disposed above a sensor element 1 (above the surface on the opposite side from the substrate 11). The reflected light as being a reflected light L1 as well as an extraneous light L2 (environment light) enters to the diode element 20. In this case, in accordance with the light amount of the light (the reflected light L1 and the extraneous light L2) entering to the diode element 20, the electric charge is released from a capacitive element 30 through a path P1 (refer to FIG. 1), and an output voltage Vo decreases.

As indicated in FIG. 5, at a timing (2), under the conditions that $\phi 1$ and $\phi 2$ are set to constant values, V1 is raised to V1 (on) and the diode element 10 is turned on, and V2 is raised to V2 (off) and the diode element 20 is turned off. At this time, for example, it is assumed as follows. The visible light or the infrared light emitted from the back side of the diode elements 10 and 20 is turned off in synchronization with the off-state of the diode element 20, and there is no light reflected by the object such as the finger, and the pen disposed above the sensor element 1. Only the extraneous light L2 enters to the diode element 10. In this case, in accordance with the light amount of the light (extraneous light L2) entering to the diode element 10, the electric charge is accumulated in the capacitive element 30 through a path P2 (refer to FIG. 1), and the output voltage Vo slightly increases.

The relationship between the amounts of V1 (on), V1 (off), V2 (on), and V2 (off) described above is expressed with formulas below.

$V1(on)>V1(off)$ $V2(on)<V2(off)$

The release operation and the accumulation operation of the electric charge as described above are repeated, and the electric charge accumulated in the capacitive element 30 is finally read out as a detection signal. Specifically, the output voltage Vo is read out from the output line OUT. In the output voltage Vo obtained in this manner, the element of the extraneous light L2 is subtracted. Therefore, as indicated in FIG. 5, by performing the on-off control (switching control) of the two diode elements 10 and 20, the influence from the extraneous light L2 is eliminated, and it is possible to detect the signal reflected by the object such as the finger, and the pen disposed above the sensor element 1.

Figure 6:
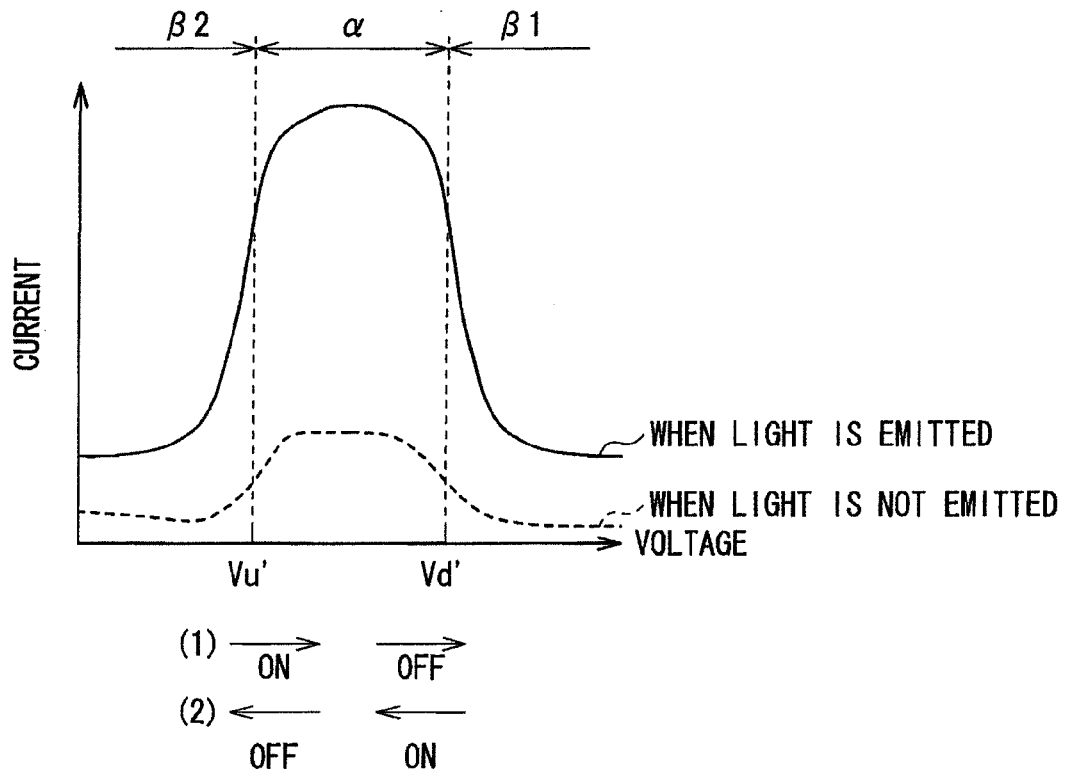
FIG. 6 is a characteristic view illustrating I-V characteristics of a diode element of FIG. 5.

FIG. 6 illustrates an example of I-V characteristics of the diode elements 10 and 20 according to modification 1. The horizontal axis indicates the gate voltage when the variation in V1 and V2 is regarded as the variation in $\phi1$ and $\phi2$, respectively, and the vertical axis indicates the current flowing through the diode elements 10 and 20. In the figure, Vu' indicates a rising voltage when the variation in V1 and V2 is regarded as the variation in $\phi1$ and $\phi2$, respectively. Vd' indicates a falling voltage when the variation in V1 and V2 is regarded as the variation in $\phi1$ and $\phi2$, respectively.

In modification 1, although it depends on the conductive type and the carrier density of the semiconductor layer 14, in the case where the voltage $\phi1$ of the gate electrode 12 in the diode element 10 and the voltage $\phi2$ of the gate electrode 12 in the diode element 20 are set to constant values, when the voltage V1 of the cathode electrode 16 in the diode element 10 is equal to or smaller than $\phi1$, and the voltage V2 of the anode electrode 15 in the diode element 20 is equal to or larger than $\phi2$, the diode element 20 is turned off, and the current is less likely to flow (refer to off-operation regions $\beta1$ and $\beta2$ in FIG. 6). On the other hand, when the voltage V1 of the cathode electrode 16 in the diode element 10 is larger than $\phi1$, and the voltage V2 of the anode electrode 15 in the diode element 20 is smaller than $\phi2$, the diode element 20 is turned off, and the current is less likely to flow (refer to the off-operation regions $\beta1$ and $\beta2$ in FIG. 6).

Therefore, also in modification 1, by positively utilizing the I-V characteristics of the diode elements 10 and 20, it is possible to realize the on-off control (switching control) of the diode elements 10 and 20 with the simple configuration in which the diode elements 10 and 20 are connected in series to each other.

Also in modification 1, since the on-off control (switching control) of the diode elements 10 and 20 is performed, the capacitive element 30 is not saturated even in the case where strong extraneous light is incident in the outdoor environment or the like, and it is possible to properly detect the signal reflected by the object such as the finger, and the pen disposed above the sensor element 1.

Modification 2

Figure 7:
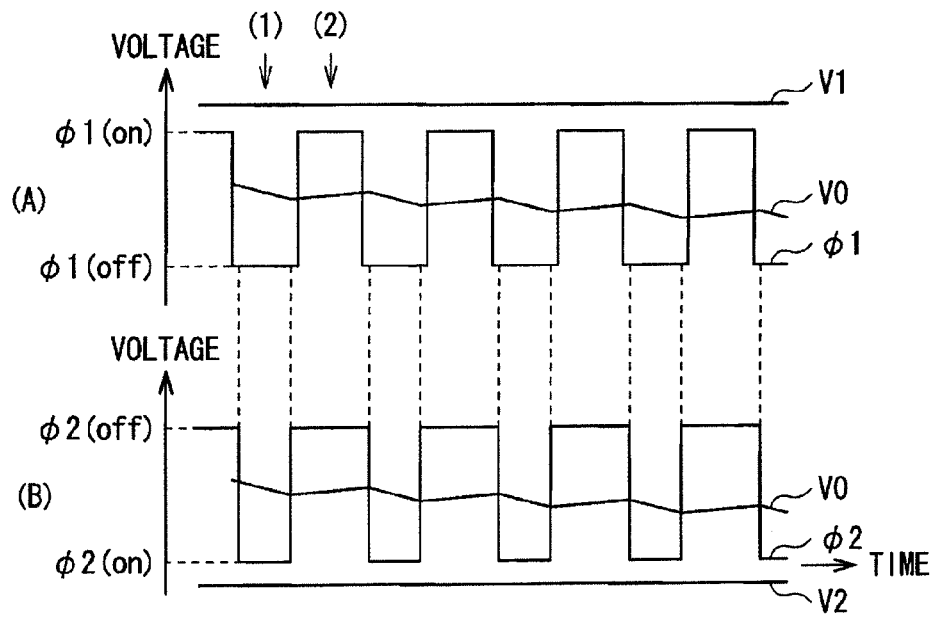
FIG. 7 is a waveform diagram for explaining still another example of the on-off control of the photo sensor element of FIG. 1.

FIGS. 7A and 7B are waveform diagrams for explaining still another example of the on-off control (switching control) of the two diode elements 10 and 20. Each of reference numerals in the figure indicates identical components as those illustrated in FIG. 3. In FIGS. 7A and 7B, similarly to FIG. 3, V1 and V2 are set to constant values, and $\phi1$ and $\phi2$ change in rectangular shapes. For better viewing of the figures, the waveforms of V1 and $\phi1$ are indicated in FIG. 7A, and the waveforms of V2 and $\phi2$ are indicated in FIG. 7B, respectively, and the waveform of an output voltage Vo is indicated in both FIGS. 7A and 7B.

As indicated in FIGS. 7A and 7B, at a timing (1), under the conditions that V1 and V2 are set to constant values, $\phi1$ is reduced to $\phi1$ (off) and a diode element 10 is turned off, and $\phi2$ is reduced to $\phi2$ (on) and a diode element 20 is turned on. At this time, for example, it is assumed as follows. Visible light or infrared light is emitted from the back (rear surface of a substrate 11) side of the diode elements 10 and 20 in synchronization with the on-state of the diode element 20, and the emitted light is reflected by an object such as a finger, and a pen disposed above a sensor element 1 (above the surface on the opposite side from the substrate 11). The reflected light as being a reflected light L1 as well as an extraneous light L2 (environment light) enters to the diode element 20. Thus, in this case, in accordance with the light amount of the light (the reflected light L1 and the extraneous light L2) entering to the diode element 20, the electric charge is released from a capacitive element 30 through a path P1 (refer to FIG. 1), and the output voltage Vo decreases.

As indicated in FIGS. 7A and 7B, at a timing (2), under the conditions that V1 and V2 are set to constant values, $\phi1$ is raised to $\phi1$ (on) and the diode element 10 is turned on, and $\phi2$ is raised to $\phi2$ (off) and the diode element 20 is turned off. At this time, for example, it is assumed as follows. The visible light or the infrared light applied from the back side of the diode elements 10 and 20 is turned off in synchronization with the off-state of the diode element 20, and there is no light reflected by the object such as the finger, and the pen disposed above the sensor element 1. Only the extraneous light L2 enters to the diode element 10. Thus, in this case, in accordance with the light amount of the light (extraneous light L2) entering to the diode element 10, the electric charge is accumulated in the capacitive element 30 through a path P2 (refer to FIG. 1), and the output voltage Vo slightly increases.

The relationship between the amounts of $\phi1$ (on), $\phi1$ (off), $\phi2$ (on), and $\phi2$ (off) described above is expressed with formulas below.

$\phi1(on)>\phi1(off)$ $\phi2(on)<\phi2(off)$

The release operation and the accumulation operation of the electric charge are repeated as described above, and the electric charge accumulated in the capacitive element 30 is finally read out as a detection signal. Specifically, the output voltage Vo is read out from the output line OUT. In the output voltage Vo obtained in this manner, the element of the extraneous light L2 is subtracted. Therefore, as indicated in FIGS. 7A and 7B, by performing the on-off control (switching control) of the two diode elements 10 and 20, the influence from the extraneous light L2 is eliminated, and it is possible to detect the signal reflected by the object such as the finger, and the pen disposed above the sensor element 1.

As indicated in FIGS. 7A and 7B, the period when the diode element 10 becomes the on-state, and the period when the diode element 20 becomes the on-state preferably do not overlap with each other.

Next, the on-off control (switching control) of the diode elements 10 and 20 in modification 2 will be described.

Figure 8:
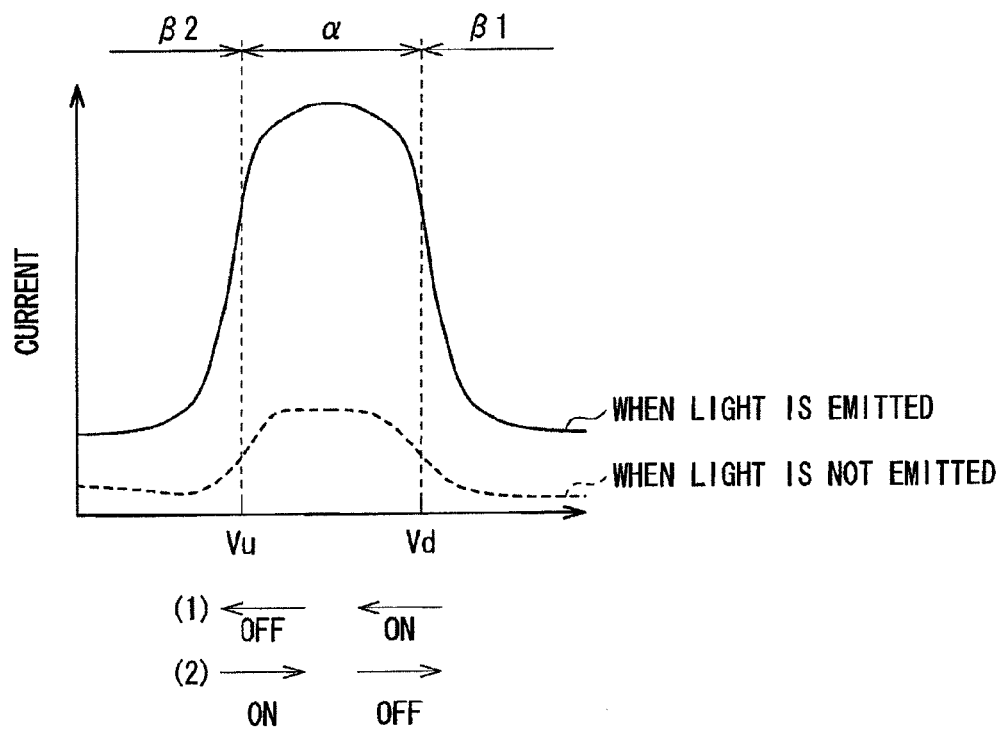
FIG. 8 is a characteristic view illustrating I-V characteristics of a diode element of FIG. 7.

FIG. 8 illustrates an example of I-V characteristics of the diode elements 10 and 20. The horizontal axis indicates the gate voltage, and the vertical axis indicates the current flowing through the diode elements 10 and 20.

Also in modification 2, as described in the embodiment, the I-V characteristics of the diode elements 10 and 20 are positively utilized, and it is possible to perform the on-off control (switching control) of the diode elements 10 and 20 by controlling the voltages $\phi1$ and $\phi2$ of the gate electrode 12.

Specifically, as indicated with (1) in FIG. 8 (corresponding to (1) in FIG. 7A), the voltage φ1 of the gate electrode 12 is shifted from φ1 (on) to φ1 (off) (shifted from an on-operation region α to an off-operation region β2). The voltage φ2 of the gate voltage 12 is shifted from φ2 (off) to φ2 (on) (shifted from an off-operation region β1 to the on-operation region α). Thereby, the diode element 10 is turned off, and the diode element 20 is turned on. At this time, formula (7) and formula (8) below are established.

$$\phi 1 < Vg1 \quad (7)$$

$$Vg3 < \phi 2 < Vg4 \quad (8)$$

As indicated with (2) in FIG. 8 (corresponding to (2) in FIG. 7A), the voltage φ1 of the gate electrode 12 is shifted from φ1 (off) to φ1 (on) (shifted from the off-operation region β2 to the on-operation region α). The voltage φ2 of the gate electrode 12 is shifted from φ2 (on) to φ2 (off) (shifted from the on-operation region α to the off-operation region β1). Thereby, the diode element 10 is turned on, and the diode element 20 is turned off. At this time, formula (5) and formula (6) below are established.

$$Vg1 < \phi 1 < Vg2 \quad (5)$$

$$Vg4 < \phi 2 \quad (6)$$

In this manner, in modification 2, by positively utilizing the I-V characteristics of the diode elements 10 and 20, the on-off control (switching control) of the diode elements 10 and 20 is realized with the simple configuration in which the diode elements 10 and 20 are connected in series to each other.

In modification 2, since the on-off control (switching control) of the diode elements 10 and 20 is performed, the capacitive element 30 is not saturated even in the case where strong extraneous light is incident in the outdoor environment or the like, and it is possible to properly detect the signal reflected by the object such as the finger, and the pen disposed above the sensor element 1.
Modification 3

Figure 9:
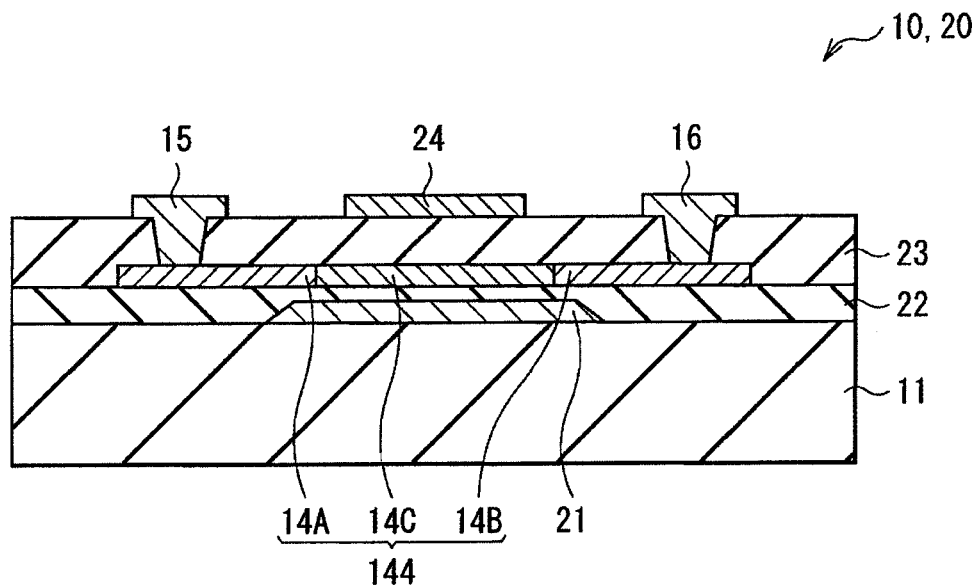
FIG. 9 is a cross-sectional view of a first modification of the diode element of FIG. 1.

In the embodiment, and modifications 1 and 2, the case where each of the diode elements 10 and 20 is a bottom-gate type thin film diode is described. However, for example, as indicated in FIG. 9, each of the diode elements 10 and 20 may be a top-gate type thin film diode including a light shielding film 21, a buffer insulating film 22, a semiconductor layer 14, a gate insulating film 23, and a gate electrode 24 on a substrate 11 in this order from the substrate 11 side.

In the above, similarly to the gate electrode 12 according to the embodiment, the light shielding film 21 is formed in a region facing at least an intrinsic semiconductor region 14C which will be described later, and has, for example, a rectangular shape. In FIG. 9, an example is indicated where the light shielding film 21 is formed in a region facing not only the intrinsic semiconductor region 14C, but also a portion including a part of a p-type semiconductor region 14A, and a part of an n-type semiconductor region 14B. Thereby, the light shielding film 21 has a function to block the light from the substrate 11 side, from entering to the region facing the portion including the intrinsic semiconductor region 14C. Moreover, similarly to the gate insulating film 13 according to the embodiment, the buffer insulating film 22 mainly contains, for example, silicon oxide (SiO2), silicon nitride (SiN), or the like. The buffer insulating film 22 is formed over the whole surface of the substrate 11 including the gate electrode 12, and serves as a planarized film.

The gate electrode 24 is formed in a region facing at least the whole intrinsic semiconductor region 14C, or a part of the intrinsic semiconductor region 14C, and has, for example, a rectangular shape. In FIG. 9, the case where the gate electrode 24 is formed in a region facing a part of the intrinsic semiconductor region 14C is indicated.
Modification 4

Figure 10:
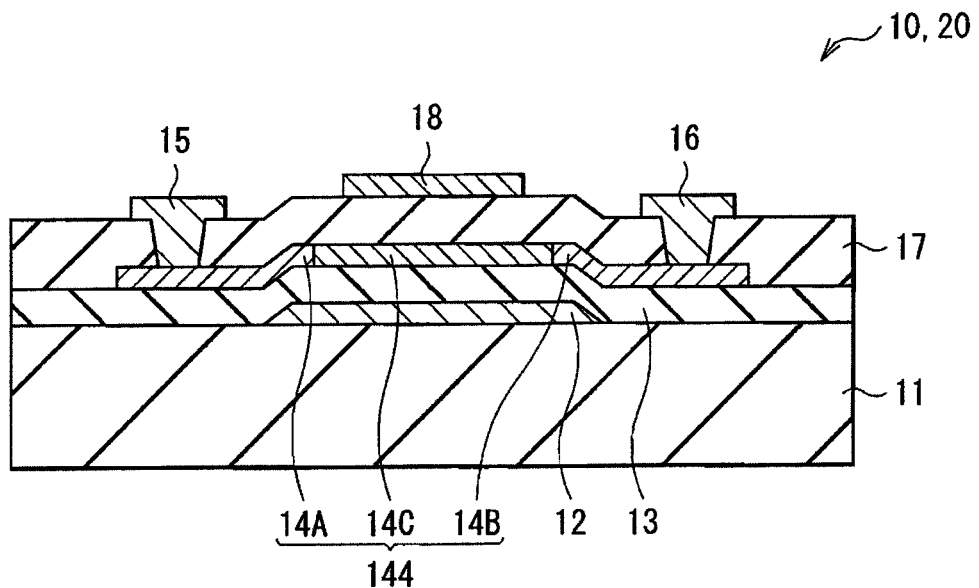
FIG. 10 is a cross-sectional view of a second modification of the diode element of FIG. 1.

As indicated FIG. 10, for example, each of diode elements 10 and 20 may be a dual-gate type thin film diode by adding a gate electrode 18 in a region facing a portion including an intrinsic semiconductor region 14C, in the surface of an insulating film 17.
Modification 5

Figure 11:
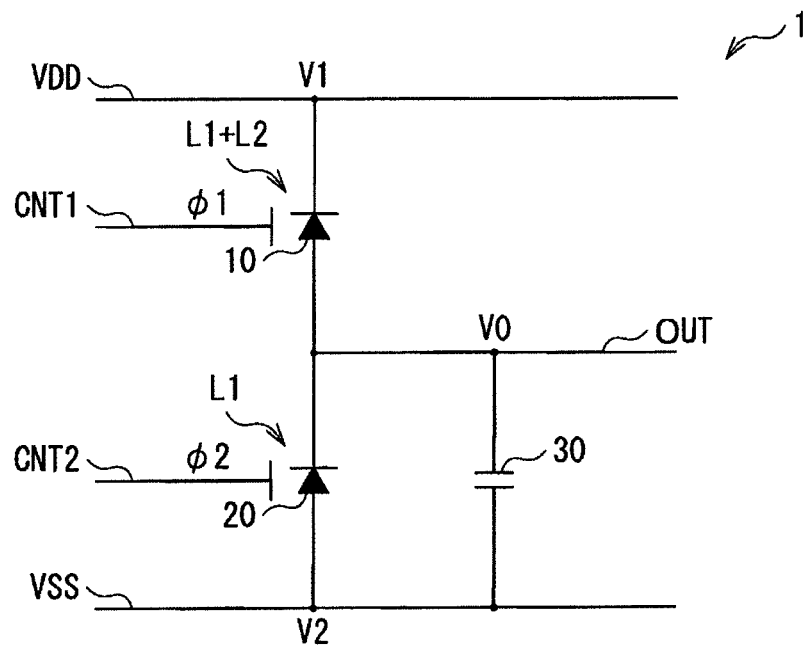
FIG. 11 is a cross-sectional view of the first modification of the lights sensor element of FIG. 1.

In the embodiment, and modifications 1 to 4, the case is described where the reflected light L1 and the extraneous light L2 enter to the diode element 20, and only the extraneous light L2 enters to the diode element 10. However, for example, as indicated in FIG. 11, a reflected light L1 and an extraneous light L2 may enter to a diode element 10, and only the extraneous light L2 may enter to a diode element 20. However, in this case, an output voltage Vo is shifted in the direction opposite from those indicated in FIGS. 3, 5, 7A and 7B.

In modifications 1 to 5, it is also possible to eliminate the intrinsic semiconductor region 14C in the semiconductor layer 14.

Next, application examples of the photo sensor element 1 according to the embodiment and modifications 1 to 5 will be described.

APPLICATION EXAMPLE 1

Figure 12:
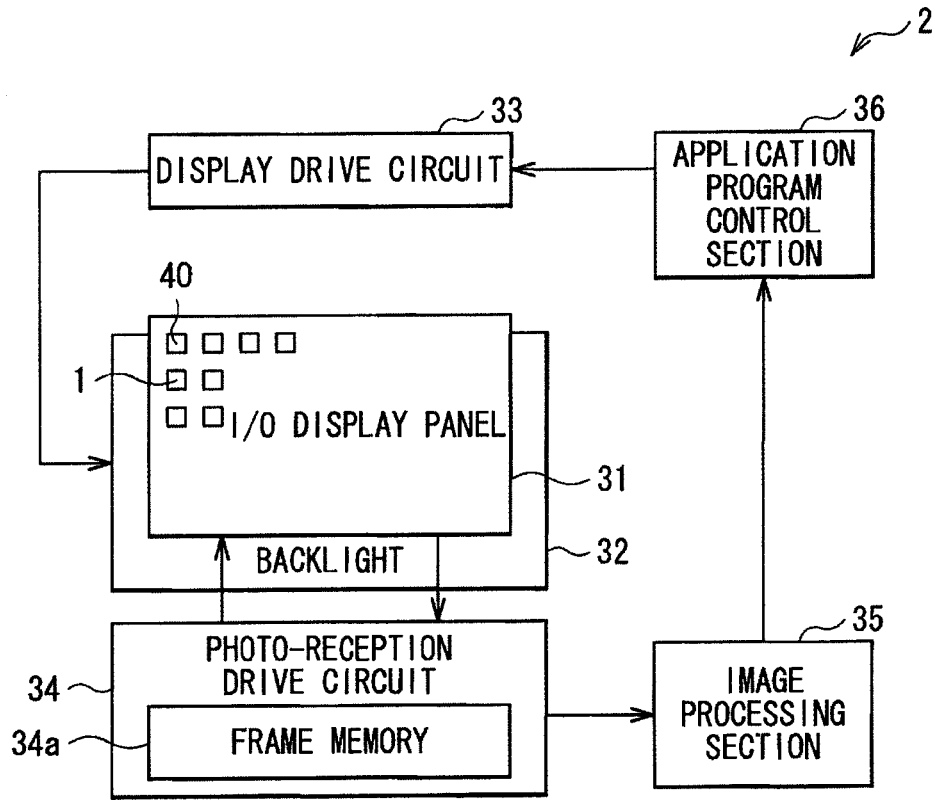
FIG. 12 is a schematic configuration view of a display device according to a first application example of the present invention.

FIG. 12 illustrates the schematic configuration of a display device 2 (display device with an input function) according to application example 1 of the present invention. Since an input device according to application example 1 of the present invention is realized with the display device 2, the description of the input device will be made with the description of the display device 2.

The display device 2 includes an I/O display panel 31, a backlight 32, a display drive circuit 33, a photo-reception drive circuit 34 (drive section), an image processing section 35, and an application program executing section 36.

The I/O display panel 31 is made of for example, a liquid crystal display (LCD) panel in which a plurality of pixels in a matrix form are arranged over a whole middle display region, and has a function to display (display function) an image such as a figure and a character which are predetermined, based on display data while performing line-sequential operation. As will be described later, in the display region of the I/O display panel 31, a photo sensor element 1 is arranged, which has a sensor function (image pickup function) detecting an object in contact with or coming close to a display plane of the I/O display panel 31.

The backlight 32 is a light source for the I/O display panel 31, and is made of, for example, a plurality of light emitting diodes aligned in the plane of the backlight 32. As will be described later, in the backlight 32, on-off operation of the light emitting diode is performed at high speed, at a predetermined timing in synchronization with the operation timing of the I/O display panel 31. The backlight 32 may emit, for example, visible light or infrared light.

The photo-reception drive circuit 34 is a circuit driving (driving with line-sequential operation) the I/O display panel 31 so that photo-reception data is obtained in the I/O display panel 31 (so that an image of the object is picked-up). The photo-reception data in each of the pixels is accumulated in, for example, a frame memory 34a for each frame, and output as the picked-up image to the image processing section 35.

The image processing section 35 performs a predetermined image processing (calculation processing) based on the picked-up image output from the photo-reception drive circuit 34, and detects and obtains information (position coordinate data, data of the shape and the size of the object, or the like) of the object which is in contact with or comes close to the I/O display panel 31.

The application program executing section 36 performs process in response to predetermined application software, based on a result detected with the image processing section 35. For example, the application program executing section 36 includes the position coordinate of the detected object in the display data, and displays the display data on the I/O display panel 31. The display data generated in the application program executing section 36 is supplied to the display drive circuit 33.

Figure 13:
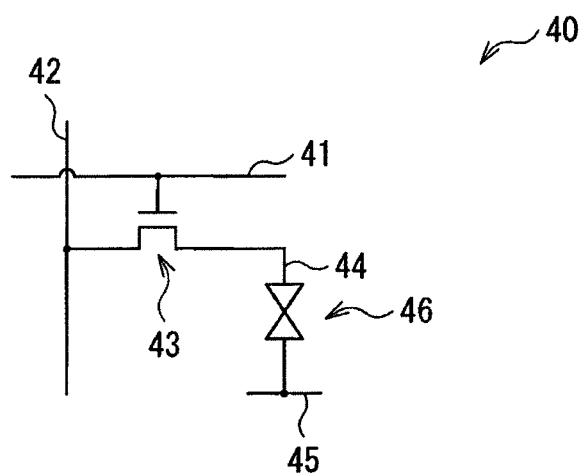
FIG. 13 is a configuration view of a pixel of FIG. 12.

FIG. 13 illustrates an example of the circuit configuration of a pixel 40 in the display region of the I/O display panel 31. In the display region of the I/O display panel 31, a plurality of pixels 40, and a plurality of sensor elements 1 are aligned.

In the display region, each of the pixels 40 is arranged at each intersection of a plurality of scanning liens 41 wired in the horizontal direction, and a plurality of signal lines 42 wired in the vertical direction. In each of the pixels 40, for example, a thin film transistor (TFT) 43 is provided as a switching element.

In the thin film transistor 43, a gate is connected to the scanning line 41, one of a source and a drain is connected to the signal line 42, and the other of the source and the drain is connected to a pixel electrode 44. In each of the pixels 40, a common electrode 45 applying common electric potential to all of the pixels 40 is provided, and a liquid crystal layer 46 is supported between each of the pixel electrodes 44 and the common electrode 45.

The thin film transistor 43 is turned on and off based on a drive signal supplied through the scanning line 41. A pixel voltage is applied to the pixel electrode 44 based on the display signal supplied from the signal line 42, when the thin film transistor 43 is in the on-state, and the liquid crystal layer 46 is driven with an electric field between the pixel electrode 44 and the common electrode 45.

Figure 14:
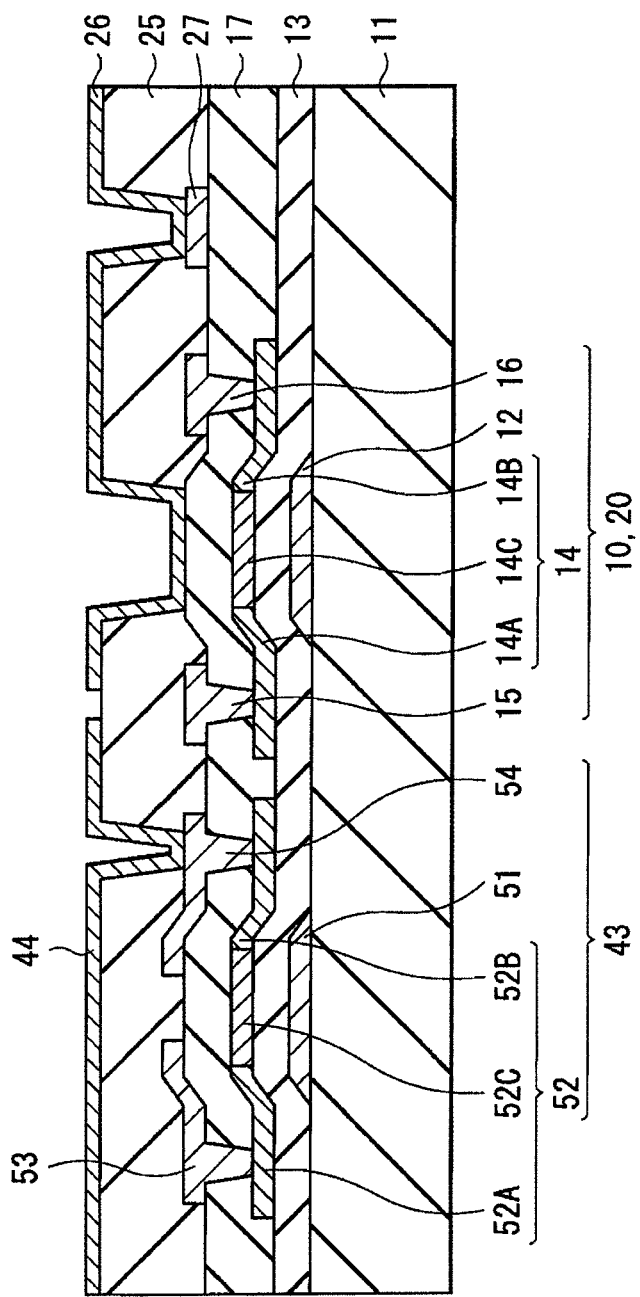
FIG. 14 is a cross-sectional view of a thin film transistor and a photo sensor element of FIG. 13.

FIG. 14 illustrates an example of the cross-sectional configuration of the thin film transistor 43 and the diode elements 10 and 20 arranged in the display region. The thin film transistor 43 has the configuration common to the diode elements 10 and 20, and is, for example, a bottom-gate type thin film transistor including a gate electrode 51, a gate insulating film 13, a semiconductor layer 52, a source electrode 53, and a drain electrode 54 on a substrate 11 in this order from the substrate 11 side. In FIG. 14, the case is indicated where a planarized film 25 covering the thin film transistor 43, and the diode elements 10 and 20, a gate electrode 26 used as a top gate, a gate wiring 27 connected to the gate electrode 26, and the pixel electrode 44 connected to the drain electrode 54 are provided.

In application example 1, the photo sensor element 1 is provided as a sensor detecting the object which is in contact with or comes close to the display plane of the I/O display panel 31, in the display region of the display panel 31. Thereby, even in the case where strong extraneous light is incident in the outdoor environment or the like, it is possible to eliminate the element of the external energy such as light, and heat from the outside without saturating the capacitive element 30. As a result, it is possible to properly detect a position of the object such as the finger, and the pen disposed above the display region.

APPLICATION EXAMPLE 2

Figure 15:
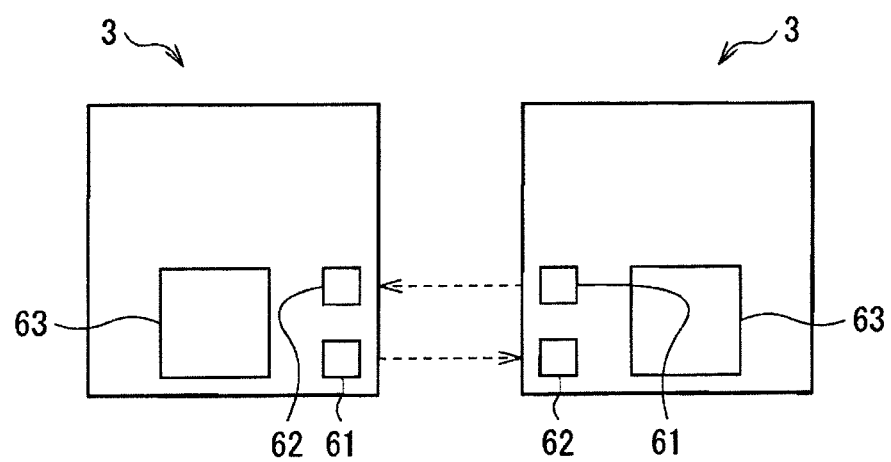
FIG. 15 is a schematic configuration view of a display device according to a second application example of the present invention.

FIG. 15 illustrates the schematic configuration of a communication device 3 according to application example 2 of the present invention. This communication device 3 includes one or more photo-emission elements 61 capable of being lighted and unlighted, a sensor element 62 made of the one or more sensor elements 1, and a drive circuit 63 driving one or more photo-emission elements 61 and the sensor element 62. In the communication device 3, a photo sensor element 1 is provided as a sensor detecting light from a photo-emission element 61 of another communication device 3. Thereby, even in the case where strong extraneous light is incident in the outdoor environment or the like, it is possible to eliminate the element of the external energy such as light, and heat from the outside, without saturating the capacitive element 30. As a result, it is possible to properly detect a position of an object such as a finger, and a pen disposed above a display region.

Hereinbefore, although the photo sensor element and the like is described with the embodiment, the modifications, and the application examples, the present invention is not limited to the embodiment and the like. The configuration of the photo sensor element or the like according to the embodiment and the like of the present invention may be freely modified as long as effects similar to those of the embodiment and the like may be obtained.

For example, in the embodiment and the like, only one of the diode element 10 and the diode element 20 is turned on when the signal light or the signal heat is applied to the semiconductor layer 14, during the period when the signal light or the signal heat is intermittently applied to the semiconductor layer 14. Moreover, only one of the diode element 10 and the diode element 20, which is turned off when the signal light or the signal heat is applied to the semiconductor layer 14, is turned on when the signal light or the signal heat is not applied to the semiconductor layer 14, during the period when the signal light or the signal heat is intermittently applied to the semiconductor layer 14. Moreover, at this time, at a predetermined timing, the diode elements 10 and 20 may be turned on at the same time, and may be turned off at the same time. For example as indicated in FIG. 3, by shifting the rising timing and the falling timing of the voltages $\phi 1$ and $\phi 2$ of the gate electrodes 12, in consideration of a margin or the like, the period when the diode elements 10 and 20 are turned on at the same time and the period when the diode elements 10 and 20 are turned off at the same time may be provided.

Although the present invention has been described with reference to the embodiments and modifications, the invention is not limited to those, and various modifications may be made.

The present application contains subject matter related to that disclosed in Japanese Priority Patent Application JP 2008-258862 filed in the Japan Patent Office on Oct. 3, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A sensor element comprising two diode elements connected in series to each other, and a capacitive element having one end connected to a junction point between the two diode elements, wherein each of the diode elements includes:

a semiconductor layer having a p-type semiconductor region and an n-type semiconductor region facing each other in an in-plane direction;
an anode electrode connected to the p-type semiconductor region;
a cathode electrode connected to the n-type semiconductor region;
a gate insulting film adjoining the semiconductor layer in a stacking direction; and
a gate electrode facing the semiconductor layer with the gate insulating film in between, and further wherein for each diode, the gate electrode is an intrinsic semiconductor gate electrode adjacent the gate insulating film.

2. The sensor element according to claim 1, wherein the semiconductor layer has an intrinsic semiconductor region between the p-type semiconductor region and the n-type semiconductor region.

3. The sensor element according to claim 1, wherein each of the diode elements generates electric charge in response to light or heat applied to the semiconductor layer.

4. The sensor element according to claim 1, wherein each of the diode elements is formed on a substrate, and the gate insulating film and the gate electrode are formed on the substrate side of the semiconductor layer.

5. The sensor element according to claim 1, wherein each of the diode elements is formed on the substrate, and the gate insulating film and the gate electrode are formed on a opposite side of the semiconductor layer from the substrate.

6. The sensor element according to claim 1, wherein each of the diode elements is formed on the substrate, the gate insulating film and the gate electrode are formed on the substrate side of the semiconductor layer, and each of the diode elements includes:
a second gate insulating film formed on a opposite side of the semiconductor layer from the gate insulating film; and
a second gate electrode facing the semiconductor layer with the second gate insulating film in between.

7. A method of driving a sensor element, the sensor element including:
two diode elements connected in series to each other, each of the diode elements including a semiconductor layer having a p-type semiconductor region and an n-type semiconductor region facing each other in an in-plane direction, an anode electrode connected to the p-type semiconductor region, a cathode electrode connected to the n-type semiconductor region, a gate insulting film adjoining the semiconductor layer in a stacking direction, and a gate electrode facing the semiconductor layer with the gate insulating film in between; and
a capacitive element having one end connected to a junction point between the two diode elements,
the method comprising:
controlling relationship of electric potential between the cathode electrode and the gate electrode in a first diode element as one of the two diode elements, the anode electrode of the first diode element being connected to the capacitive element; and
controlling relationship of electric potential between the anode electrode and the gate electrode in a second diode element as the other of the two diode elements, the cathode electrode of the second diode element being connected to the capacitive element, thereby to turn on and off the two diode elements separately from each other, and further wherein for each diode, the gate electrode is an intrinsic semiconductor gate electrode adjacent the gate insulating film.

8. The method of driving the sensor element according to claim 7, wherein
the semiconductor layer includes an intrinsic semiconductor region between the p-type semiconductor region and the n-type semiconductor region.

9. A method of driving a sensor element, the sensor element including:
two diode elements connected in series to each other, each of the diode elements including a semiconductor layer having a p-type semiconductor region and an n-type semiconductor region facing each other in an in-plane direction, an anode electrode connected to the p-type semiconductor region, a cathode electrode connected to the n-type semiconductor region, a gate insulting film adjoining the semiconductor layer in a stacking direction, and a gate electrode facing the semiconductor layer with the gate insulating film in between: and
a capacitive element having one end connected to a junction point between the two diode elements,
the method comprising:
controlling relationship of electric potential between the cathode electrode and the gate electrode in a first diode element as one of the two diode elements, the anode electrode of the first diode element being connected to the capacitive element: and
controlling relationship of electric -potential between the anode electrode and the gate electrode in a second diode element as the other of the two diode elements, the cathode electrode of the second diode element being connected to the capacitive element, thereby to turn on and off the two diode elements separately from each other, wherein
the relationship of the electric potential between the cathode electrode and the gate electrode in the first diode element, and the relationship of the electric potential between the anode electrode and the gate electrode in the second diode element are controlled so that following relationship are satisfied, where $\phi1$ (on) is an on-state voltage of the gate electrode and $\phi1$ (off) is an off-state voltage of the gate electrode in the first diode element, and $\phi2$ (on) is an on-state voltage of the gate electrode and $\phi2$ (off) is an off-state voltage of the gate electrode in the second diode element $$\phi1(on)<\phi1(off),$$

$$\phi2(on)>\phi2(off).$$

10. A method of driving a sensor element, the sensor element including;
two diode elements connected in series to each other, each of the diode elements including a semiconductor layer having a p-type semiconductor region and an n-type semiconductor region facing each other in an in-plane direction, an anode electrode connected to the a-type semiconductor region, a cathode electrode connected to the n-type semiconductor region, a gate insulting film adjoining the semiconductor layer in a stacking direction, and a gate electrode facing the semiconductor layer with the gate insulating film in between; and
a capacitive element having one end connected to a junction point between the two diode elements,
the method comprising:
controlling relationship of electric potential between the cathode electrode and the gate electrode in a first diode element as one of the two diode elements, the anode electrode of the first diode element being connected to the capacitive element; and controlling relationship of electric potential between the anode electrode and the gate electrode in a second diode element as the other of the two diode elements, the cathode electrode of the second diode element being connected to the capacitive element, thereby to turn on and off the two diode elements separately from each other, wherein the relationship of the electric potential between the cathode electrode and the gate electrode in the first diode element, and the relationship of the electric potential between the anode electrode and the gate electrode in the second diode element are controlled so that following relationship are satisfied, where V1 (on) is an on-state voltage of the cathode electrode and V1 (off) is an off-state voltage of the cathode electrode in the first diode element, and V2 (on) is an on-state voltage of the anode electrode and V2 (off) is an off-state voltage of the anode electrode in the second diode element $$V1(on) < V1(off)$$

$$V2(on) > V2(off).$$

11. A method of driving a sensor element, the sensor element including:

two diode elements connected in series to each other, each of the diode elements including a semiconductor layer having a p-type semiconductor region and an n-type semiconductor region facing each other in an in-plane direction, an anode electrode connected to the p-type semiconductor region, a cathode electrode connected to the n-type semiconductor region, a gate insulting film adjoining the semiconductor layer in a stacking direction, and a gate electrode facing the semiconductor layer with the gate insulating film in between; and a capacitive element having one end connected to a junction point between the two diode elements, the method comprising;

controlling relationship of electric potential between the cathode electrode and the gate electrode in a first diode element as one of the two diode elements, the anode electrode of the first diode element being connected to the capacitive element; and controlling relationship of electric potential between the anode electrode and the gate electrode in a second diode element as the other of the two diode elements, the cathode electrode of the second diode element being connected to the capacitive element, thereby to turn on and off the two diode elements separately from each other, wherein the relationship of the electric potential between the cathode electrode and the gate electrode in the first diode element, and the relationship of the electric potential between the anode electrode and the gate electrode in the second diode element are controlled so that following relationship are satisfied, where $\phi 1$ (on) is the on-state voltage of the gate electrode and $\phi 1$ (off) is the off-state voltage of the gate electrode in the first diode element, and $\phi 2$ (on) is the on-state voltage of the gate electrode and $\phi 2$ (off) is the off- state voltage of the gate electrode in the second diode element $$\phi 1(on) > \phi 1(off)$$

$$\phi 2(on) < \phi 2(off).$$

12. A method of driving a sensor element, the sensor element including:

two diode elements connected in series to each other, each of the diode elements including a semiconductor layer having a p-type semiconductor region and an n-type semiconductor region facing each other in an in-plane direction, an anode electrode connected to the p-type semiconductor region, a cathode electrode connected to the n-type semiconductor region, a gate insulting film adjoining the semiconductor layer in a stacking direction, and a gate electrode facing the semiconductor layer with the gate insulating film in between; and a capacitive element having one end connected to a junction point between the two diode elements, the method comprising:

controlling relationship of electric potential between the cathode electrode and the gate electrode in a first diode element as one of the two diode elements, the anode electrode of the first diode element being connected to the capacitive element: and controlling relationship of electric potential between the anode electrode and the gate electrode in a second diode element as the other of the two diode elements, the cathode electrode of the second diode element being connected to the capacitive element, thereby to turn on and off the two diode elements separately from each other, wherein the relationship of the electric potential between the cathode electrode and the gate electrode in the first diode element, and the relationship of the electric potential between the anode electrode and the gate electrode in the second diode element are controlled so that following relationship (1) and (2) are satisfied with $\phi 1$ and $\phi 2$ when the first diode element is turned on and the second diode element is turned off, and so that following relationship (3) and (4) are satisfied with $\phi 1$ and $\phi 2$ when the first diode element is turned off and the second diode element is turned on, where Vg1 is a rise voltage defined as a specific gate voltage where output current rapidly increases and Vg2 is a fall voltage defined as a specific gate voltage where the output current rapidly decreases when the gate voltage is gradually raised in the first diode element, Vg3 is a rise voltage defined as a specific gate voltage where output current rapidly increases and Vg4 is a fall voltage defined as a specific gate voltage where the output current rapidly decreases when the gate voltage is gradually raised in the second diode element, and $\phi 1$ is a voltage of the gate electrode in the first diode element and $\phi 2$ is a voltage of the gate electrode in the second diode element $$Vg1 < \phi 1 < Vg2 \tag{1}$$

$$\phi 2 < Vg3 \tag{2}$$

$$Vg2 < \phi 1 \tag{3}$$

$$Vg3 < \phi 2 < Vg4. \tag{4}$$

13. A method of driving a sensor element. the sensor element including:

two diode elements connected in series to each other, each of the diode elements including a semiconductor layer having a p-type semiconductor region and an n-type semiconductor region facing each other in an in-plane direction, an anode electrode connected to the p-type semiconductor region, a cathode electrode connected to the n-type semiconductor region, a gate insulting film adjoining the semiconductor layer in a stacking direction, and a gate electrode facing the semiconductor layer with the gate insulating film in between; and a capacitive element having one end connected to a junction point between the two diode elements, the method comprising:

controlling relationship of electric potential between the cathode electrode and the gate electrode in a first diode element as one of the two diode elements, the anode electrode of the first diode element being connected to the capacitive elements; and controlling relationship of electric potential between the anode electrode and the gate electrode in a second diode element as the other of the two diode elements, the cathode electrode of the second diode element being connected to the capacitive element, thereby to turn on and off the two diode elements separately from each other, wherein the relationship of the electric potential between the cathode electrode and the gate electrode in the first diode element, and the relationship of the electric potential between the anode electrode and the gate electrode in the second diode element are controlled so that following relationship (5) and (6) are satisfied with $\phi 1$ and $\phi 2$ when the first diode element is turned on and the second diode element is turned off, and so that following relationship (7) and (8) are satisfied with $\phi 1$ and $\phi 2$ when the first diode element is turned off and the second diode element is turned on, where Vg1 is a rise voltage defined as a specific gate voltage where output current rapidly increases and Vg2 is a fall voltage defined as a specific gate voltage where the output current rapidly decreases when the gate voltage is gradually raised in the first diode element, Vg3 is a rise voltage defined as a specific gate voltage where output current rapidly increases and Vg4 is a fall voltage defined as a specific gate voltage where the output current rapidly decreases when the gate voltage is gradually raised in the second diode element, and $\phi 1$ is a voltage of the gate electrode in the first diode element and $\phi 2$ is a voltage of the gate electrode in the second diode element.

$$Vg1 < \phi 1 < Vg2 \quad (5)$$

$$Vg4 < \phi 2 \quad (6)$$

$$\phi 1 < Vg1 \quad (7)$$

$$Vg3 < \phi 2 < Vg4. \quad (8)$$

14. A method of driving a sensor element, the sensor element including:

two diode elements connected in series to each other, each of the diode elements including a semiconductor layer having p-type semiconductor region and an n-type semiconductor region facing each other in an in-plane direction, an anode electrode connected to the n-type semiconductor region, a cathode electrode connected to the n-type semiconductor region, a gate insulting film adjoining the semiconductor layer in a stacking direction, and a gate electrode facing the semiconductor layer with the gate insulating film in between: and a capacitive element having one end connected to a junction point between the two diode elements, the method comprising:

controlling relationship of electric potential between the cathode electrode and the gate electrode in a first diode element as one of the two diode elements, the anode electrode of the first diode element being connected to the capacitive element; and controlling relationship of electric potential between the anode electrode and the gate electrode in a second diode element as the other of the two diode elements, the cathode electrode of the second diode element being connected to the capacitive element, thereby to turn on and off the two diode elements separately from each other, wherein in such a case that signal light or signal heat is intermittently applied to the semiconductor layer, only one of the first diode element and the second diode element is turned on when signal light or signal heat is applied to the semiconductor layer, and only one of the first diode element and the second diode element, which is turned off when the signal light or the signal heat is applied to the semiconductor layer, is turned on when the signal light or the signal heat is not applied to the semiconductor layer.

15. An input device comprising a plurality of sensor elements arranged in a matrix form in a plane and a drive section driving the plurality of sensor elements, each of the sensor elements including two diode elements connected in series to each other and a capacitive element having one end connected to a junction point between the two diode elements, each of the diode elements including:

a semiconductor layer having a p-type semiconductor region and an n-type semiconductor region facing each other in an in-plane direction;

an anode electrode connected to the p-type semiconductor region;

a cathode electrode connected to the n-type semiconductor region;

a gate insulting film adjoining the semiconductor layer in a stacking direction; and a gate electrode facing the semiconductor layer with the gate insulating film in between, wherein the drive section turns on and off the two diode elements separately from each other through controlling:

relationship of electric potential between the cathode electrode and the gate electrode in a first diode element as one of the two diode elements, the anode electrode of the first diode element being connected to the capacitive element; and relationship of electric potential between the anode electrode and the gate electrode in a second diode element as the other of the two diode elements, the cathode electrode of the second diode element being connected to the capacitive element, and further wherein for each diode, the gate electrode is an intrinsic semiconductor gate electrode adjacent the gate insulating film.

16. The input device according to claim 15, further comprising:

a light source arranged in back of the plurality of sensor elements.

17. A display device with an input function comprising a plurality of display elements and a plurality of sensor elements arranged in a matrix form in a plane and a drive section driving the plurality of display elements and the plurality of sensor elements, each of the sensor elements including two diode elements connected in series to each other and a capacitive element having one end connected to a junction point between the two diode elements, each of the diode elements including:

a semiconductor layer having a p-type semiconductor region and an n-type semiconductor region facing each other in an in-plane direction;
an anode electrode connected to the p-type semiconductor region;
a cathode electrode connected to the n-type semiconductor region;
a gate insulting film adjoining the semiconductor layer in a stacking direction; and
a gate electrode facing the semiconductor layer with the gate insulating film in between, wherein
the drive section turns on and off the two diode elements separately from each other through controlling:
relationship of electric potential between the cathode electrode and the gate electrode in a first diode element as one of the two diode elements, the anode electrode of the first diode element being connected to the capacitive element; and
relationship of electric potential between the anode electrode and the gate electrode in a second diode element as the other of the two diode elements, the cathode electrode of the second diode element being connected to the capacitive element, and further wherein for each diode, the gate electrode is an intrinsic semiconductor gate electrode adjacent the gate insulating film.

18. A communication device comprising one or more sensor elements and a drive section driving the plurality of sensor elements, each of the sensor elements including two diode elements connected in series to each other and a capacitive element having one end connected to a junction point between the two diode elements, each of the diode elements including:
  a semiconductor layer having a p-type semiconductor region and an n-type semiconductor region facing each other in an in-plane direction;
  an anode electrode connected to the p-type semiconductor region;
  a cathode electrode connected to the n-type semiconductor region;
  a gate insulting film adjoining the semiconductor layer in a stacking direction; and
  a gate electrode facing the semiconductor layer with the gate insulating film in between, wherein
  the drive section turns on and off the two diode elements separately from each other through controlling:
  relationship of electric potential between the cathode electrode and the gate electrode in a first diode element as one of the two diode elements, the anode electrode of the first diode element being connected to the capacitive element; and
  relationship of electric potential between the anode electrode and the gate electrode in a second diode element as the other of the two diode elements, the cathode electrode of the second diode element being connected to the capacitive element, and further wherein for each diode, the gate electrode is an intrinsic semiconductor gate electrode adjacent the gate insulating film.

* * * * *